United States Patent [19]

Kanno et al.

[11] Patent Number: 5,516,366
[45] Date of Patent: May 14, 1996

[54] SUPPLY CONTROL SYSTEM FOR SEMICONDUCTOR PROCESS GASSES

[75] Inventors: Yohichi Kanno; Osamu Uchisawa; Kohichi Murakami, all of Miyagi; Tadahiro Ohmi, Sendai, all of Japan

[73] Assignee: Kabushiki-Kaisha Motoyama Seisakusho, Ohira, Japan

[21] Appl. No.: 322,940

[22] Filed: Oct. 12, 1994

[30] Foreign Application Priority Data

Oct. 13, 1993 [JP] Japan .................... 5-255414

[51] Int. Cl.⁶ ................. C23C 16/00; F17D 1/04
[52] U.S. Cl. .................... 118/715; 137/596.16
[58] Field of Search .............. 137/606, 596.16; 251/30.01; 118/715

[56] References Cited

U.S. PATENT DOCUMENTS

| | | | |
|---|---|---|---|
| 3,796,229 | 3/1974 | Wright | 137/495 |
| 4,080,154 | 3/1978 | Kinsella | 431/43 |
| 4,358,927 | 11/1982 | Day | 60/290 |
| 4,369,031 | 1/1983 | Goldman | 432/198 |
| 4,426,683 | 1/1984 | Kissell | 364/508 |
| 5,160,542 | 11/1992 | Mihira | 118/715 |
| 5,250,323 | 10/1993 | Miyazaki | 427/255.1 |
| 5,322,568 | 6/1994 | Ishihara | 118/715 |

*Primary Examiner*—R. Bruce Breneman
*Assistant Examiner*—Jeffrie R. Lund
*Attorney, Agent, or Firm*—Baker & Daniels

[57] ABSTRACT

A supply control apparatus for semiconductor process gasses which is capable of accurately switching the timing of the supply state of the gasses flowing in accordance with the open or closed states of a plurality of gas pressure operated valves, which operate in response to a plurality of electromagnetic valves operating in time series. The content volumes of a plurality of gas tubes respectively connecting the plurality of electromagnetic valves to the plurality of drive units of the gas pressure operated valves are determined as a function of the length of time elapsed between the application of the control signal and the time the special gas is supplied to a process unit. The apparatus permits accurate switching of the supply state of the special gasses and avoids the mixing of the semiconductor process gasses.

20 Claims, 7 Drawing Sheets

SUPPLY CONTROL SYSTEM FOR SEMICONDUCTOR PROCESS GASSES

TECHNICAL FIELD

The present invention relates to a supply control apparatus for special gasses possessing gas-pressure operated valves (typically, air-operated valves) operated by a drive unit in accordance with the opened or closed state of the valve units of electromagnetic valves; this apparatus controls the supply of special gasses to a unit to be processed in accordance with the opened or closed state of the main valve units of these gas-pressure operated valves.

BACKGROUND OF THE INVENTION

Conventionally, typical apparatuses of this type have included, for example, in the single wafer processing of wafers comprising the process technology of semiconductor device manufacturing, supply control apparatuses for process gasses which supply a special, high-purity process gas (a special material gas or a purge gas) to the interior of each processing chamber. Such supply control apparatuses for process gasses are provided with, as shown for example in FIG. 11: a controller 61; an electromagnetic valve assembly 62, which is provided with a plurality of electromagnetic valves 62A–62E, the valve units of which operate individually in accordance with control signals from the controller 61; air-operated valves 63A–63E, which are provided in correspondence with the plurality of electromagnetic valves 62A–62E, and which comprise a plurality of gas pressure operated valves, comprising a gas system assembly 63; a plurality of flexible air tubes 64a–64e, for guiding an operating gas (air), which flows in accordance with the open or closed state of the valve units of the plurality of electromagnetic valves 62A–62E, to the drive units of the air-operated valves 63A–63E; and a plurality of process gas supply sources 65a–65d, which are connected to the upstream side (the primary pressure side) of the main valve units of air-operated valves 63A–63E, respectively. In addition, a predetermined processing chamber 67 (or 68), comprising the unit to be processed, is connected to the downstream side (the secondary pressure side) of the main valve units of air-operated valves 63A–63E, via connecting pipes 66a–66e; a special gas (a desired process gas) is supplied to processing chamber 67 in accordance with the open or closed state of the main valve units of the air-operated valves 63A–63E.

In this case, the inner diameters of each air tube 64a–64e are set so as to be equal (having, for example, an inner diameter of 4 mm); however, as a result of the positioning of the air-operated valves 63A–63E, the length of these air tubes is simply set so as to be as short as possible in accordance with the distance separating the electromagnetic valves 62A–62E, and the air-operated valves 63A–63E corresponding thereto. Accordingly, it is commonly the case that the maximum length among the air tubes is on the level of 3 to 4 times that of the shortest length thereamong.

On the other hand, the open or closed state of the electromagnetic valves 62A–62E is chiefly controlled by means of a mechanism which is electrically operated, while air-operated valves 63A–63E are chiefly controlled by means of a mechanism which is mechanically operated; as a result, while the operating time of electromagnetic valves 62A–62E (that is to say, the time from the point at which the drive unit inputs a predetermined control signal to the point at which the open or closed state of the valve unit of the electromagnetic valve is switched) is normally on the order of milliseconds, while the operating time of air-operated valves 63A–63E (that is to say, the time from the point at which the open or closed state of the electromagnetic valve is switched to the point at which the opened or closed state of the main valve unit of the air-operated valve is switched) is on the order of 0.2–2.5 seconds.

The connecting pipes 66a–66e, which connect the main valve units of the air-operated valves 63A–63E and the processing chambers 67 and 68, are normally formed of corrosion-resistant materials (typically, stainless steel), since special material gasses are caused to flow therethrough; the shapes and positional relationships thereof differ in accordance with the method of the apparatus, and are constant. Furthermore, by way of caution, it should be said that FIG. 11 depicts the schematic structure of the electromagnetic valves, air-operated valves, and other peripheral structural members which are shown in the Figures attached to the present specification; as a result, the size relationships or positional relationships or the like of the members differ from those which are actually employed.

In such a supply control apparatus, electromagnetic valves 62A–62E are employed because the electrical control thereof is a simple matter, while air-operated valves 63A–63E are employed because they are advantageous in the handling of special material gasses. Accordingly, in addition to creating a structure in which two types of valves are employed, it becomes impossible to instantaneously (at least on the order of the operating time of the electromagnetic valves) conduct the switching of the unit to be processed of the process gas, and in addition, the lengths of the connecting pipes 66a–66e, and the lengths of the air tubes 64a–64e, vary, so that the time from the point at which a control signal is outputted from controller 61 to the point at which the individual process gasses flow into the predetermined processing chamber 67 (the gas supply operating time) varies according to the flow paths of the individual process gasses.

However, when the gas supply operating times vary depending on the flow path of the process gasses, as in the structure of the conventional technology described above, it is the case that, for example, when the switching of the supply of the unit to be processed of the process gas is conducted between a mode in which the distance separating the electromagnetic valve and the air-operated valve is long, and a mode in which this distance is short, a state is produced in which two types of process gasses are mixed, at least within a limited time period during this switching.

Concretely, in FIG. 11, in the state in which a process gas is supplied to a predetermined processing chamber 66 at a predetermined flow rate via connecting pipe 66c as a result of the operation of air-operated valve 63C via air tube 64c as a result of the opening of electromagnetic valve 62C, when switching is conducted to a state in which another process gas is supplied to the processing chamber 67 at a predetermined flow rate via connecting pipe 66a as a result of the opening of air-operated valve 63A via an air tube 64a, which is shorter than the air tube 64c, as a result of the opening of electromagnetic valve 62A, the other process gas is supplied in a mixed state at a point in time at which the first process gas is still being supplied to processing chamber 67. In this case, when the length of the connecting pipe 66a is shorter than that of the connecting pipe 66c, the mixed supply state of the process gas may become more pronounced.

In other words, even when highly accurate setting of the flow rates of the process gasses is conducted in advance, high purity processing cannot be conducted in the processing chamber at least during switching periods, and the product quality and yield is reduced to that extent. The use of a method in which the timing of the switching is controlled by means of the timer control of controller 61 in accordance with the state of the gas flow path of the process gasses has been considered as one means to avoid the mixed supply state of the process gasses described above; however, in such a method, the setting of the sequence of the timing is complicated, and as a result, such a method cannot be expected to result in the precise supply of process gasses.

The present invention was created in order to solve the problems present in the conventional technology described above; it has as an object thereof to provide a supply control apparatus for special gasses in which the operating time of the gas pressure operated valves activated after the operation of the electromagnetic valves can be easily controlled, and as a result, the timing of the switching of the supply states of the special gasses can be accurately conducted in accordance with the open or closed state of the gas pressure operated valves which operate in reaction to the electromagnetic valves which are operated in a time series.

SUMMARY OF THE INVENTION

In order to solve the problems present in the conventional technology described above, the main structure of the present invention is characterized in that, in a supply control apparatus for special gasses which is provided with: a plurality of electromagnetic valves, which are placed in an open or closed state in accordance with predetermined control signals; a plurality of gas pressure operated valves which are individually placed in an open or closed state in accordance with the individual open or closed state of the plurality of electromagnetic valves; a plurality of gas tubes through which operating gasses are caused to flow, connected between the individual valve units in the plurality of electromagnetic valves and the drive units of each gas pressure operated valve, operating in response to the operating gasses flowing through the individual valve units; and a unit to be processed for supplying special gasses flowing through the main valve units of the individual gas pressure operated valves, via connecting pipes, in accordance with the open or closed state of the plurality of gas pressure operated valves; the plurality of gas tubes have individual content volumes which are set in accordance with the time from the input of a control signal to the supply of special gas to the unit to be processed, where the content volume is a volume of gas in a tube of given length and inner diameter.

In, for example, the case in which switching is conducted from the supply state of a first special gas to the supply state of a second special gas, when a first electromagnetic valve is in an open state, and a second electromagnetic valve is in a closed state, at a first point in time which is established in advance in a time series, a valve closing signal comprising a control signal is supplied to the drive unit of the first electromagnetic valve, and the first electromagnetic valve is placed in a closed state, and after this, at a second point in time which was established in advance in the time series after the first point in time, a valve opening signal comprising a control signal is supplied to the drive unit of the second electromagnetic valve, and the second electromagnetic valve is placed in an open state; operations in this case are as follows. As a result of the closing of the first electromagnetic valve, the supply of the operating gas via a first gas tube is halted, and the open state of the first gas pressure operated valve is ended, and the supply of the first special gas flowing via the first gas pressure operated valve to the unit to be processed is halted, while as result of the operating gas flowing via the second gas tube as a result of the opening of the second electromagnetic valve, the second gas pressure operated valve is placed in an open state, and the supply of a second special gas flowing via this second gas pressure operated valve is initiated. In this case, the first and second gas tubes are set so as to possess appropriate content volumes in consideration of the positional relationships between the individual gas pressure operated valves and electromagnetic valves, so that it is possible to so establish the operating time of the first gas pressure operated valve resulting from the closure of the first electromagnetic valve, and the operating time of the second gas pressure operated valve resulting from the opening of the second electromagnetic valve, which determine the time necessary for supplying the special gas to the unit to be processed, so that these times do not overlap, and it is thus possible to avoid the state in which both special gasses are supplied in a mixed manner.

Figure 1:
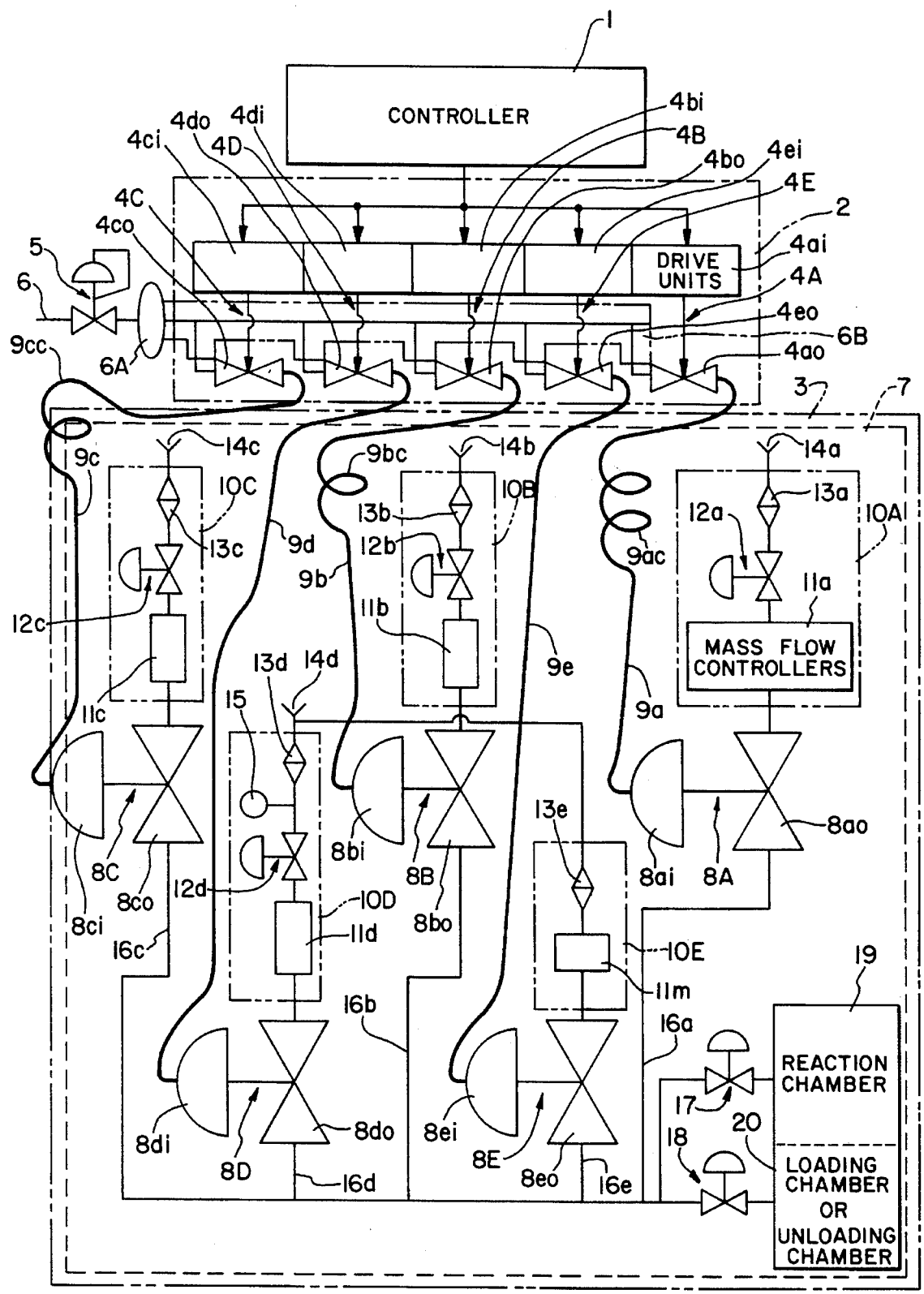
FIG. 1 is a block diagram showing the structure of a first embodiment of the present invention.

DESCRIPTION OF THE REFERENCE NUMERALS 1 controller
2 electromagnetic valve assembly
3 gas system assembly
4A–4E electromagnetic valves
8A–8E air-operated valves
9a–9e air tubes
19 reaction chamber

DESCRIPTION OF THE PREFERRED EMBODIMENT

FIG. 1 shows the block structure of an embodiment of a supply control apparatus for special gasses in accordance with the present invention. As shown in the Figure, the present embodiment chiefly comprises a controller 1, an electromagnetic valve assembly 2, and a gas system assembly 3; the electromagnetic assembly 2 and the gas system assembly 3 are disposed so as to adjoin one another. Here, the control signals from the controller 1 are established in advance by timer control in a time series (for example, at unit setting times corresponding to the minimum operational interval of the electromagnetic valves); these control signals are supplied to the drive units 4ai–4ei of a plurality of normally-closed-type electromagnetic valves 4A–4E which comprise electromagnetic valve assembly 2. In addition, a supply line 6 for air comprising the operational gas is connected to the primary pressure side of the electromagnetic main valve units 4ao–4eo of electromagnetic valves 4A–4E, and a regulating valve 5 is provided on the supply line 6.

The operational gas may comprise an inert gas or the like in addition to the air which is used in the present embodiment; it is necessary to consider factors such as economic cost and the like as practical problems, but any gas may be employed as long as it does not present a hindrance to the operation of the gas pressure operated valves (the air-operated valves 8A–8E described hereinbelow) based on the operation of the electromagnetic valves 4A–4E.

In the electromagnetic valve assembly 2, a buffer tank 6A (or a volume tank) and a manifold 6B are provided between the primary pressure side of each electromagnetic main valve unit 4ao–4eo and regulating valve 5; these form an equalization maintenance mechanism for the air in each electromagnetic main Valve unit 4ao–4eo.

The gas system assembly 3 possesses an assembly base 7, and a plurality (in the present embodiment, 5, but this number may be chosen appropriately in accordance with the method employed) of air-operated valves 8A–8E comprising normally closed gas pressure operated valves are disposed on the assembly base 7 at predetermined intervals. Air tubes 9a–9e are connected between the secondary pressure side of the electromagnetic main valve units 4ao–4eo in electromagnetic valves 8A–8E and the drive units 8ai–8ei in the air-operated valves 8A–8E corresponding thereto.

Here, the air tubes 9a–9e comprise easily workable materials, which are flexible and malleable yet sufficiently strong enough to withstand operating gas pressure, for example, resin materials such as teflon or the like, have inner diameters of, for example, 4 mm, and outer diameters of 6 mm, and the content volumes thereof are set to a predetermined value. Furthermore, the air tubes 9a–9c possess coil-shaped parts 9ac–9cc which are wound so as to have a suitable form in accordance with the necessary individual amount of regulation. Therefore, these materials must allow the tubes to be easily manufactured to various lengths and inner diameters, and be wound into coils.

In air-operated valves 8A–8C, mass flow controllers 11a 11c which comprise process gas regulators 10A–10C, regulating valves 12a–12c, and filter-attached valves 13a–13c are provided in that order on the primary pressure side of the main valve units 8ao–8co in the direction of the gas supply sources 14a–14c, respectively; in air-operated valve 8D, a mass flow controller 11d comprising a process gas regulator 10D, a regulating valve 12d, a gas pressure meter 15, and a filter-attached valve 13d are provided in that order on the primary pressure side of the main valve unit 8 do in the direction of the diluting gas (or purge gas) supply source 14d; and in air-operated valve BE, a mass flow meter 11e comprising a process gas regulator 10E, and a filter-attached valve 13e are provided in that order on the primary pressure side of the main valve unit 8eo in the direction of supply source 14d.

Furthermore, connecting pipes 16a–16e are connected in air-operated valves 8A–8E at the secondary pressure side of the main valve units 8ao–8eo, respectively; regulating valves 17 and 18 are provided at the confluence points at the downstream end of connecting pipes 16a–16e; and a reaction chamber 19 comprising a processing chamber is provided via regulating valve 17, while a loading chamber (or unloading chamber) 20 is provided via regulating valve 18.

Next, as an example of the operation of the present embodiment having the structure described above, an explanation will be made of operations in which, in the case in which, in the state in which, for example, a special material gas (for example, silane gas) is being supplied from a gas supply source 14c, or a diluting gas (for example, nitrogen gas) is being supplied from a gas supply source 14d, at a predetermined flow rate, to the reaction chamber 19, switching is conducted so as to supply a different special material gas (for example, phosphene gas) from a gas Supply source 14a at a predetermined flow rate to the reaction chamber 19, that is to say, in the state in which air-operated valves 8A and 8B, and air-operated valve 8E are in closed states; operations from the point in time at which air-operated valves 8C and 8D are in open states, to the point in time at which air-operated valve 8C is placed in a closed state, and air-operated valve 8A is placed in an opened state, will be explained. The distance separating electromagnetic valve 4A and air-operated valve 8A is set so as to be smaller than the distance separating electromagnetic valve 4C and air-operated valve 8C.

In such a state, at a certain point in time, a valve-closing signal constituting a control signal is supplied from the controller 1 to the drive unit 4ci of the electromagnetic valve 4C, and the electromagnetic valve 4C is placed in a closed state, and at a point in time at which the unit setting time described above has been allowed to elapse after this point in time, a valve-opening signal constituting a control signal is supplied to the drive unit 4ai of the electromagnetic valve 4A and the electromagnetic valve 4A enters an opened state, and thereupon, the supply of air flowing via air tube 9c is halted, and the air-operated valve 8C enters a fully closed state, and thereafter, air is supplied to the drive unit 8ai of air-operated valve 8A via air tube 9a, and air-operated valve 8A enters a fully open state.

The operation time of the air-operated valve 8C after the operation of the electromagnetic valve 4C, and the operation time of the air-operated valve 8A after the operation of the electromagnetic valve 4A, can be set to a desired appropriate value by the adjustment of the length of air tubes 9c and 9a, and concretely by an increase or decrease in the number of winds of the coil-shaped parts 9cc and 9ac, respectively. In other words, even in the case in which the distance separating the electromagnetic valve 4A and the air-operated valve 8A is shorter than the distance separating the electromagnetic valve 4C and the air-operated valve 8C, it is a simple matter to set the gas supply operating time, with respect to the silane gas and phosphene gas mentioned above (the time from the input of control signals to electromagnetic valves 4A and 4C to the complete cessation of the supply of silane gas to the reaction chamber 19 and the completion of the initiation of supply of phosphene gas thereto), so as to be equal to the unit setting time described above.

That is to say, in the case of the present embodiment, the switching from the supply of silane gas to that of phosphene gas is always conducted at intervals equivalent to the unit setting time, so that there is no danger that both gasses will be supplied in a mixed state to the reaction chamber during the switching. In controller 1, if the setting is conducted so as to make allowance for a degree of safety with respect to the unit setting time, and so as not to exert an influence on the total operating time, it is possible to avoid such a mixed state in a more satisfactory manner. In the preceding explanation, the switching of air-operated valves 8A and 8C was explained; however, it is possible to make a similar explanation with respect to the switching of the supply states of special material gasses by means of a combination of other air-operated valves.

Furthermore, in the present embodiment, an equalization maintenance mechanism comprising manifold 6B and the like is provided, so that the gas pressure of the air which is supplied to valve units 4ao–4eo of electromagnetic valves 4A–4E in electromagnetic valve assembly 2 is always maintained at a constant value. That is to say, no effects are exerted on the operating time of a gas pressure operated valve based on the operation of an electromagnetic valve, as a result of the operation of a gas pressure operated valve based on the operation of another electromagnetic valve.

In the present embodiment, normally-closed valves were used as the electromagnetic valves and the air-operated valves; however, it is possible to provide a structure utilizing normally-open valves which achieves the same effects.

Figure 2:
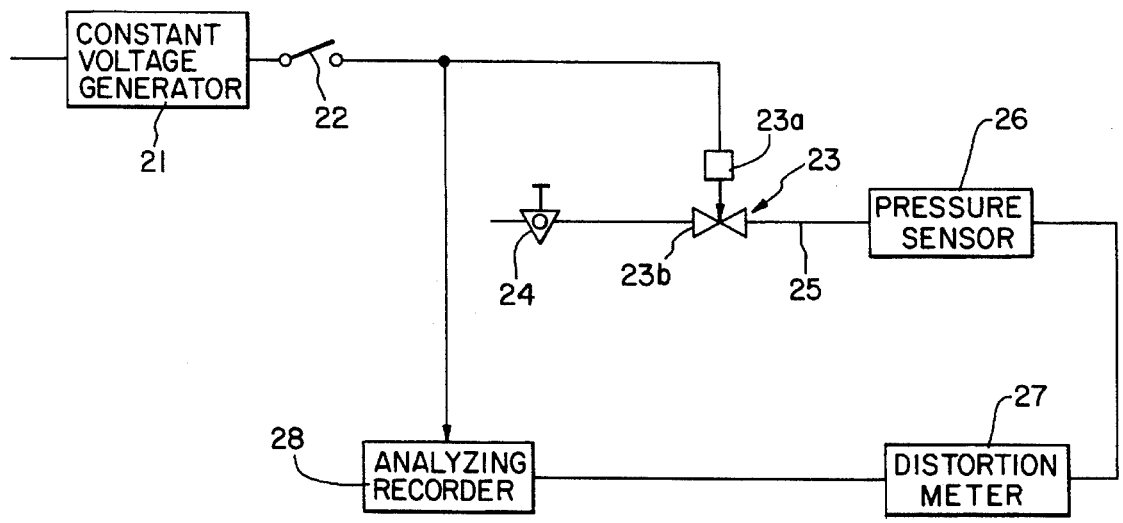
FIG. 2 is a block diagram showing the circuit structure used to measure the secondary pressure increase time of the electromagnetic valves shown in FIG. 1.

FIG. 2 shows an example of an apparatus for measuring the secondary pressure increase time of a valve unit in an electromagnetic valve used in the present embodiment; in the measuring apparatus, a direct current constant voltage, which is outputted from a constant voltage generator 21 which is connected to an alternating current power source of a commercial frequency, is supplied to the drive unit 23a of an electromagnetic valve 23 via a switch 22, and air comprising an operating gas which is supplied via a regulating valve 24 is supplied to the primary pressure side of valve unit 23b of the electromagnetic valve 23, and a pressure sensor 26 is provided at the downstream end of an air tube 25 which is connected to the secondary pressure side of the valve unit 23b. In addition, the output of the pressure sensor 26 is supplied to a distortion meter 27, and the output of distortion meter 27 is supplied to analyzing recorder 28.

Figure 3:
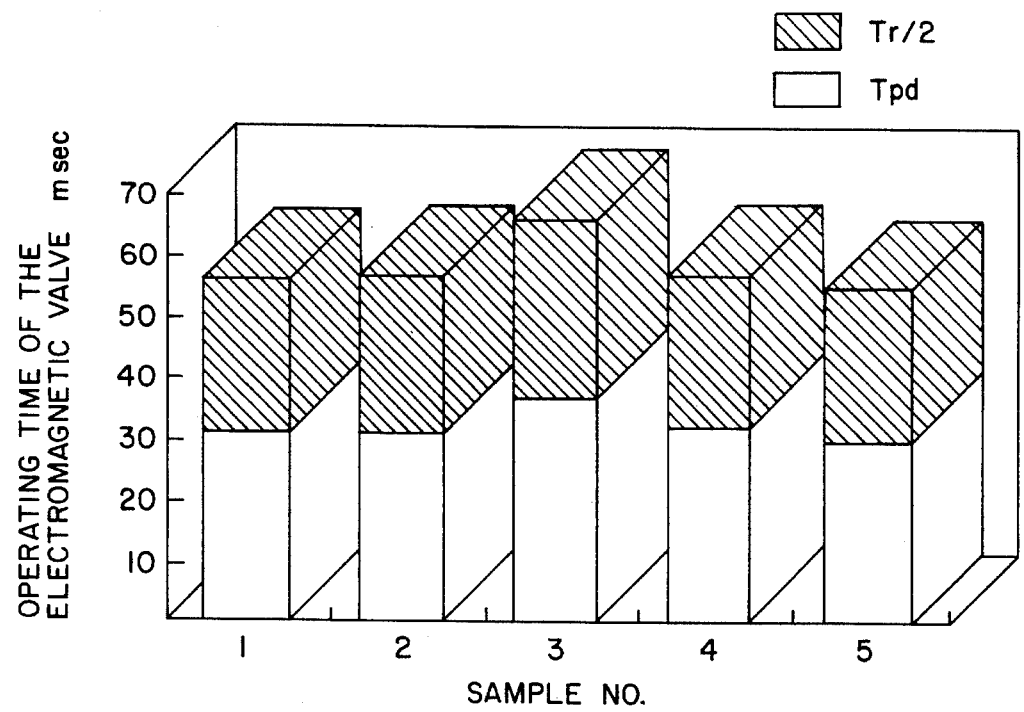
FIG. 3 is a graph showing an example of the measurement by means of the circuit structure shown in FIG. 2.

FIG. 3 shows the results of a number of measurements with respect to the operating time of the electromagnetic valve 23, employing the apparatus shown in FIG. 2, and, using an air tube 25 having an inner diameter of 6 mm, an outer diameter of 8 mm, and a length of 1 m. In this case, what is meant by the operating time is, as is shown in the Figure, a time corresponding to the sum of the propagation delay time Tpd and the rise time Tr, and in further detail, Tpd indicates the time to a degree of opening which is one-half the fully-open state, while Tr indicates the time from 10% of the fully-open state to 90% thereof. In other words, the operating time indicates the time from the engaging of switch 22 to the point in time at which valve unit 23b attains a fully-open state. In the present measurement example, the primary pressure of the valve unit 23b of electromagnetic valve 23 is set to 4 kgf/cm$^2$ by means of the adjustment of regulating valve 24.

As shown in FIG. 3, in all of the measurement examples, the valve of Tpd was approximately 30 msec and the value of Tr/2 was approximately 25 msec, so that it can be seen that the sum thereof, Tpd +(Tr/2), had a value of approximately 55 msec.

Figure 4:
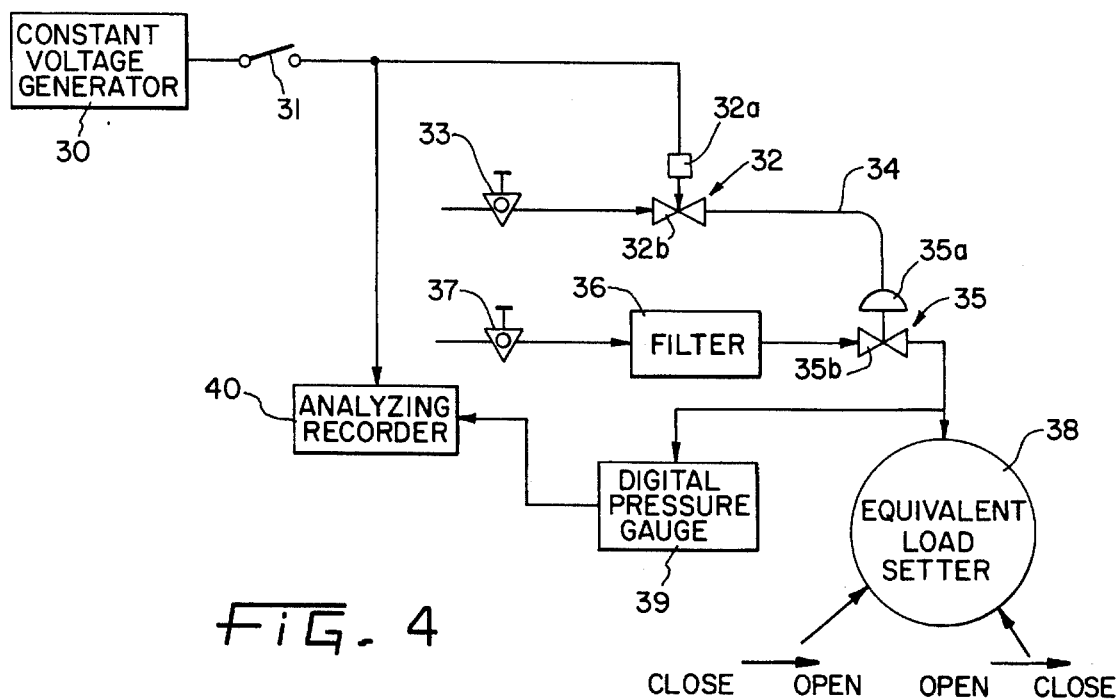
FIG. 4 is a block diagram of a circuit structure used in the measurement of the secondary pressure increase time of the air-operated valve as a result of the operation of the electromagnetic valves of FIG. 1.

On the other hand, FIG. 4 shows an example of an apparatus for the measurement of the secondary pressure increase time of a main valve unit of a normally-closed air-operated valve which is used in the present embodiment. In this measurement apparatus, an air tube 34 is connected to the secondary pressure side of the valve unit 32b of electromagnetic valve 32, and furthermore, the drive unit 35a of an air-operated valve 35 is connected to the downstream end of the air tube 34, and a special gas supply source, for testing is provided on the primary pressure side of main valve unit 35b of air-operated valve 35 via a filter 36 and a regulating valve 37; an equivalent load setter 38 (a device which is able to apply a load which is fluid dynamically equivalent to that of an actual gas system with respect to either normally-closed or normally-open valves, and is thus capable of testing) is connected to the secondary pressure side of the main valve unit 35b, and a digital, pressure gauge 39 is connected thereto. Furthermore, reference numeral 30 indicates a constant voltage generator, reference numeral 31 indicates a switch, reference numeral 32a indicates the drive unit of electromagnetic valve 32, reference numeral 33 indicates a regulating valve, and reference numeral 40 indicates an analyzing recorder; the apparatus possesses functions which are similar to those of the measurement apparatus of FIG. 2.

Figure 5:
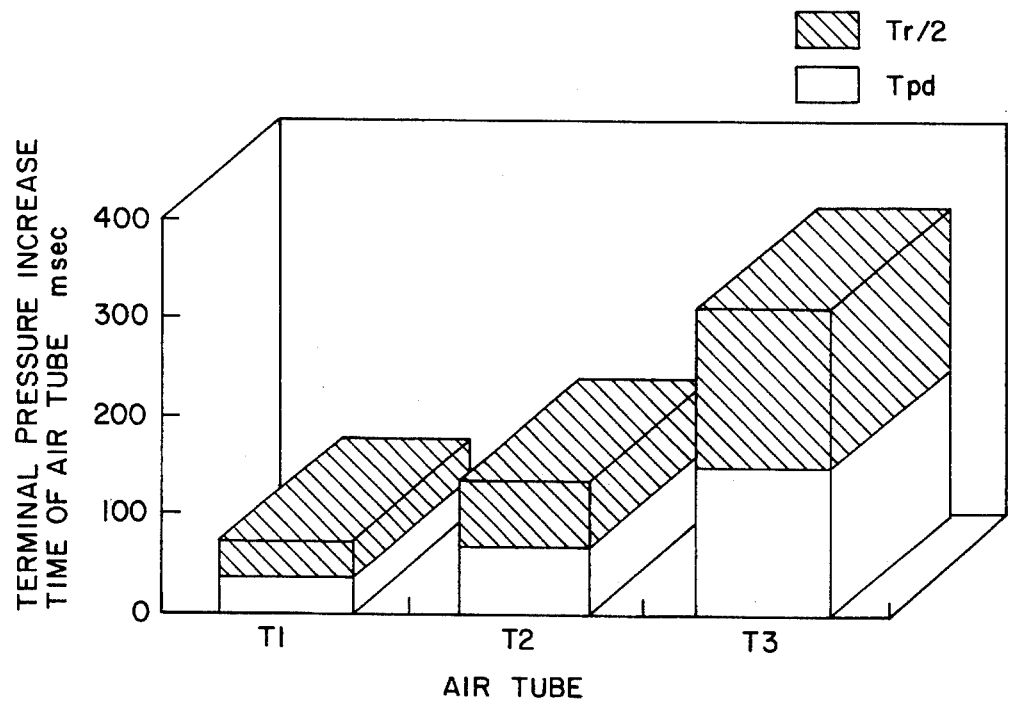
FIG. 5 is a graph showing the variation in the secondary pressure increase time in the case in which the inner diameter of the gas tube is changed.

FIG. 5 shows the results of a measurement, using the apparatus shown in FIG. 4 and with respect to air tubes 34 having three differing internal diameters and having a length of 1 m in each case, of the terminal pressure increase time of air tubes 34 after the operation of electromagnetic valve 32, in other words, of the time from the engagement of switch 31 to the point at which main valve unit 35b attains a fully-opened state. Here, in the Figure, reference Tpd indicates the time, from the end of the operation of electromagnetic valve 32, at which the terminal pressure of an air tube 34 reaches a pressure corresponding to 50% of the fully-opened state, and Tr/2 indicates the time from 50% of the fully-opened state to 90% thereof.

Among the 3 types of air tubes used in the present measurement example, air tube T1 has an internal diameter of 2.5 mm, and an external diameter of 4 mm; air tube T2 has an internal diameter of 4 mm, and an external diameter of 6 mm; while air tube T3 has an internal diameter of 6 mm, and an external diameter of 8 mm. Furthermore, the primary pressure of electromagnetic valve 32 is set to 4 kgf/cm$^2$ by means of regulating valve 33, and the primary pressure of main valve unit 35b of air-operated valve 35 is set to 1 kgf/cm$^2$.

As shown in FIG. 5, the terminal pressure increase times when the air tubes T1, T2, and T3 described above were employed were such that with respect to air tube T1, Tpd and Tr/2 had values of, respectively, approximately 40 msec, so that the sum thereof was approximately 80 msec, and with respect to air tube T2, Tpd and Tr/2 had, respectively, values of approximately 60 msec, so that the sum thereof was approximately 120 msec, and in addition, with respect to air tube T3, the values of Tpd and Tr/2 were, respectively, approximately 130 and 150 msec, so that the sum thereof was approximately 280 msec. In other words, it can be seen that the terminal pressure increase time is lengthened as the inner diameter of the air tube increases.

Figure 6:
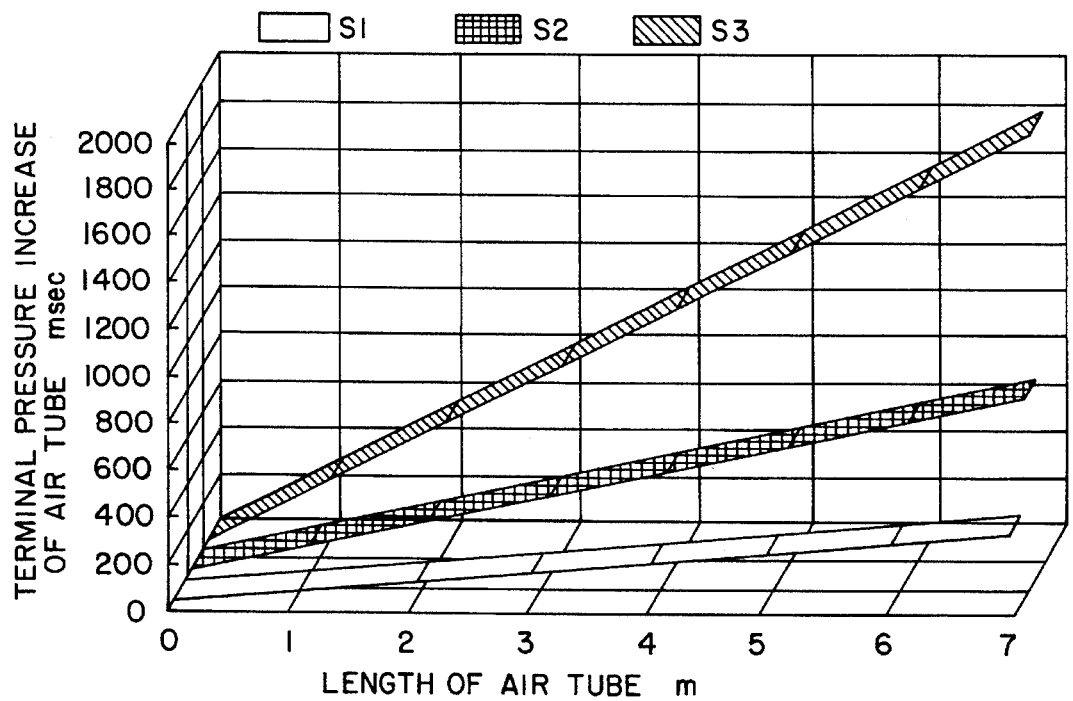
FIG. 6 is a graph showing the variation in the secondary pressure increase time in the case in which the length of the gas tube is changed.

FIG. 6 shows the results of a measurement of the secondary pressure increase time (Tpd+(Tr/2)) of an air-operated valve 35 using the apparatus shown in FIG. 4, in the case in which the length of air tube 34 was varied from 1 m to 7 m and air tube sizes S1, S2, and S3 were employed (Si: inner diameter 2.5 mm, and outer diameter 4 mm; S2: inner diameter 4 mm, and outer diameter 6 mm; S3: inner diameter 6 mm, and outer diameter 8 mm).

The results shown in FIG. 6 are such that the values obtained with respect to air tube size S1 were within a range of approximately 50–90 msec, the values obtained with respect to air tube size S2 were within a range of approximately 70–620 msec, and furthermore, the values obtained with respect to air tube size S3 were within a range of approximately 220–1780 msec, so that it can be seen that the time becomes proportionately longer in accordance with the increase in the length of the air tubes.

Figure 7:
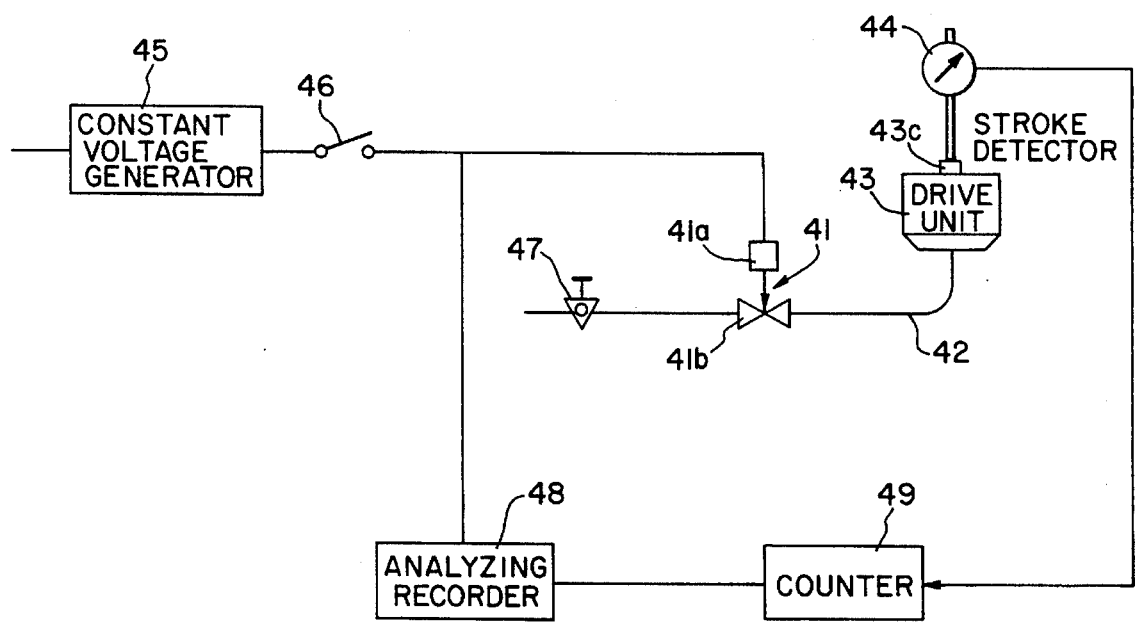
FIG. 7 is a block diagram of the circuit structure used in the measurement of the stroke time of the drive unit element of the air-operated valve.

FIG. 7 shows an example of an apparatus for the measurement of the stroke time of a drive unit element in an air-operated valve employed in the present embodiment; in the measurement apparatus, a drive unit element 43 is connected to the downstream end of an air tube 42 (having an inner diameter of 2.5 mm and an outer diameter of 4 mm and a length of 1 m which is connected to the secondary pressure side of a valve unit 41b of an electromagnetic valve 41, and a stroke detector 43c of the drive unit element 43 is in contact with a linear gauge 44, and the readings of the linear gauge 44 can be inputted into a counter 49. Reference numeral 45 indicates a constant voltage generator, reference numeral 46 indicates a switch, reference numeral 4a indicates the drive unit of electromagnetic valve 41, reference numeral 47 indicates a regulating valve, and reference numeral 48 indicates an analyzing recorder; the apparatus has similar functions to those of the measurement apparatus of FIG. 2.

Figure 8:
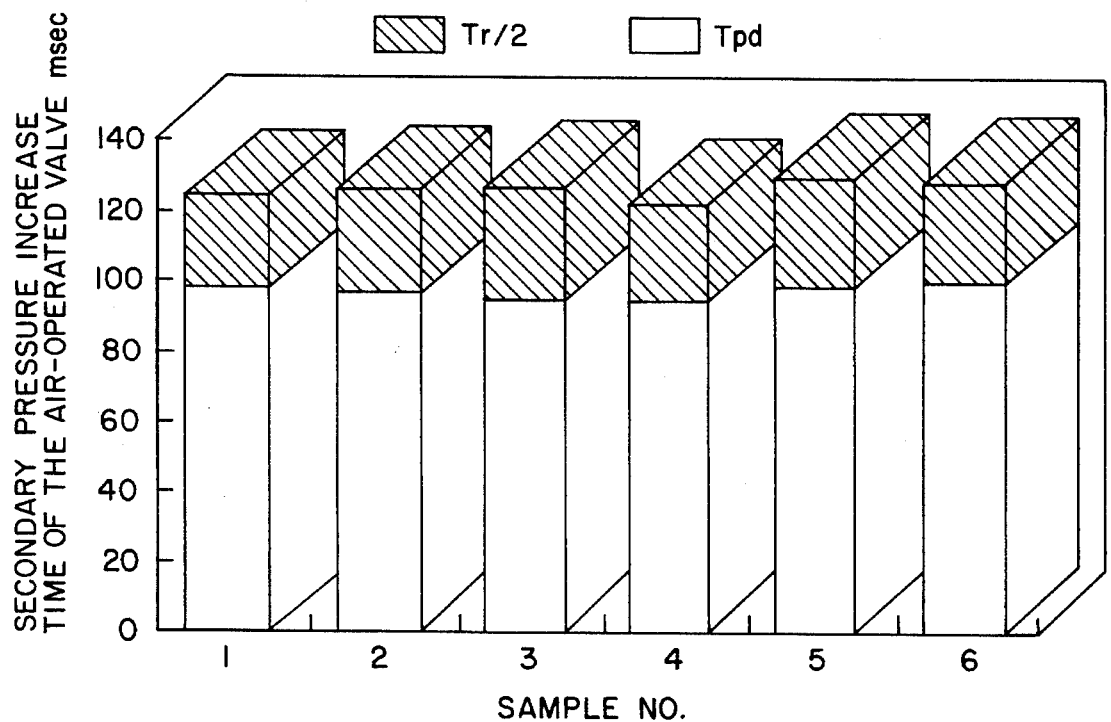
FIG. 8 is a graph showing an example of the measurement of the stroke time of the drive unit of the air-operated valve.

FIG. 8 shows the results of the measurement of the stroke time of a drive unit element 43 in a normally-closed air-operated valve, and more concretely, shows the results of measurements over a number of cycles of the time required from the engagement of a switch 46 until the stroke detector 43c moves to a predetermined stroke pressure position. In FIG. 8, the stroke time was such that Tpd had a value of approximately 100 msec, and Tr/2 had a value of approximately 25 msec, so that it can be seen that the sum thereof is 125 msec.

It can be seen from the results shown in FIGS. 3 and 8 above that the secondary pressure increase time of the electromagnetic valve and the secondary pressure increase time of the drive unit element of the air-operated valve are essentially constant, so that the operating time of the air-operated valve after the operation of the electromagnetic valve, which determines the gas supply operating time, is determined by the length and inner diameter of the air tube, that is to say, by the content volume of the air tube. To explain further, it is possible to accurately control (at least on the order of 0.1 secs) the timing of the switching of the open and closed state of a plurality of air-operated valves simply by the appropriate adjustment of the content volume of the air tubes.

Figure 9A:
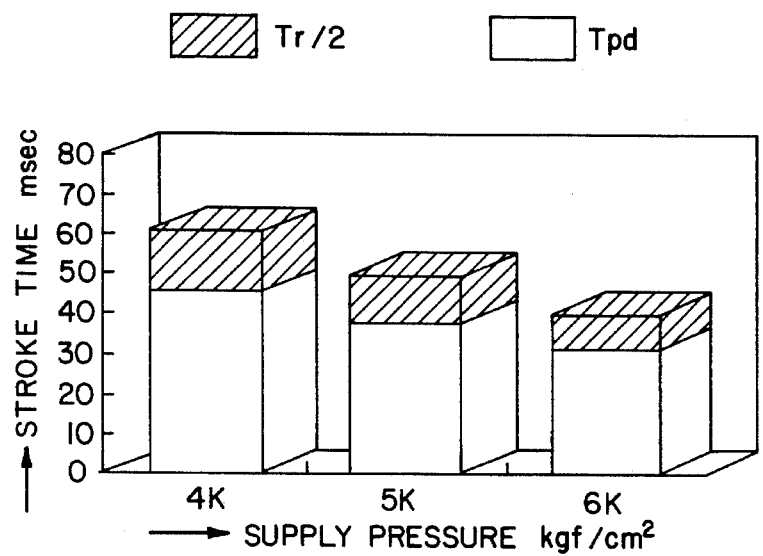
FIG. 9a–9b are graph showing the result of the measurement of the stroke time of the drive unit of the air-operated valve with respect to the change in the supply pressure of the operating gas.
Figure 9B:
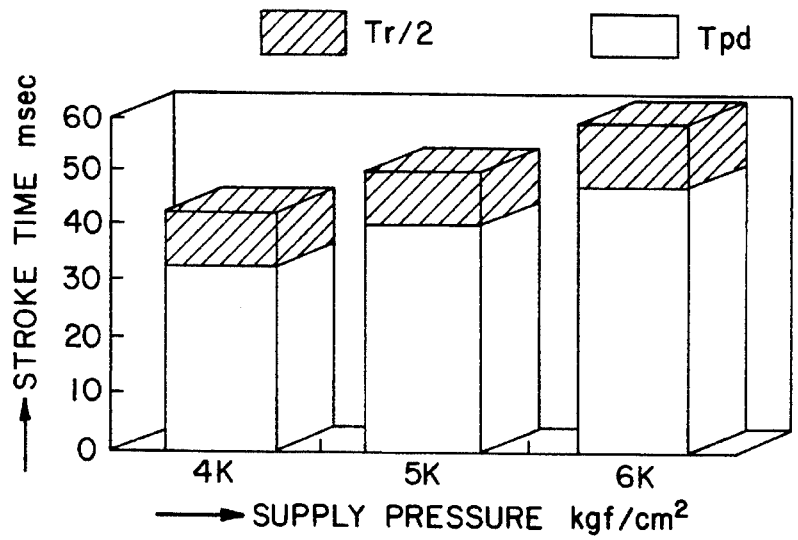

FIG. 9 shows the results of a measurement of the stroke time of a drive unit element of an air-operated valve with respect to a variation in the supply pressure of the operating gas; FIG. 9(a) shows the case in which a normally-closed valve is employed, while FIG. 9(b) indicates a normally-opened valve is employed. It can be seen from the Figures that in the case of the normally-closed valve, as the supply pressure increases, the stroke time shortens by only a slight amount (by a value of approximately 20 msec with respect to a change of 2 kgf/cm² in the operating gas pressure) in correspondence thereto, and on the other hand, in the case of the normally-open valve, the stroke time is lengthened by only a slight amount. Fluctuations in the stroke time of such a drive unit, and fluctuations in the operating time of the air-operated valve, can be easily avoided, as in the present embodiment, by providing a buffer tank 6A (or a volume tank) comprising an equalization maintenance mechanism, and a manifold 6B. With respect to other measurement conditions during the present measurement, the air tube which is interposed between the valve unit of the electromagnetic valve and the drive unit of the air-operated valve has an outer diameter of 4 mm, an inner diameter of 2.5 mm, and a length of 1 m.

In the present embodiment, it has been proven that the relationship between the operating time t of the air-operated valve after the operation of the electromagnetic valve and the content volume V of the air tube is given by the formula shown below.

Formula 1

$$t = 5.21 \cdot k \cdot V/S \qquad (1)$$

In Formula (1) above, reference k indicates the time coefficient, and reference S indicates the inner diameter of the air tube.

In the present embodiment, when the content volume of the air tubes 9a–9e was adjusted, adjustment was conducted by changing the length thereof; however, it is of course the case that it is also possible to adjust the inner diameter, as can be seen from the explanation of FIG. 5 and from the content of Formula (1). In other words, as is shown in Formula (1) above, when the length of the air tube is constant, the operating time t of the air-operated valve is proportional to the inner diameter S of the air tube.

Furthermore, in the embodiment described above, in the case in which a mechanism for the equalization maintenance of the operating gas (air) is provided at the primary pressure side of the electromagnetic main valve units 4ao–4eo, the use of a tube having an inner diameter which is larger than the inner diameter of the air tubes (9a–9e) is most appropriate.

Figure 10:
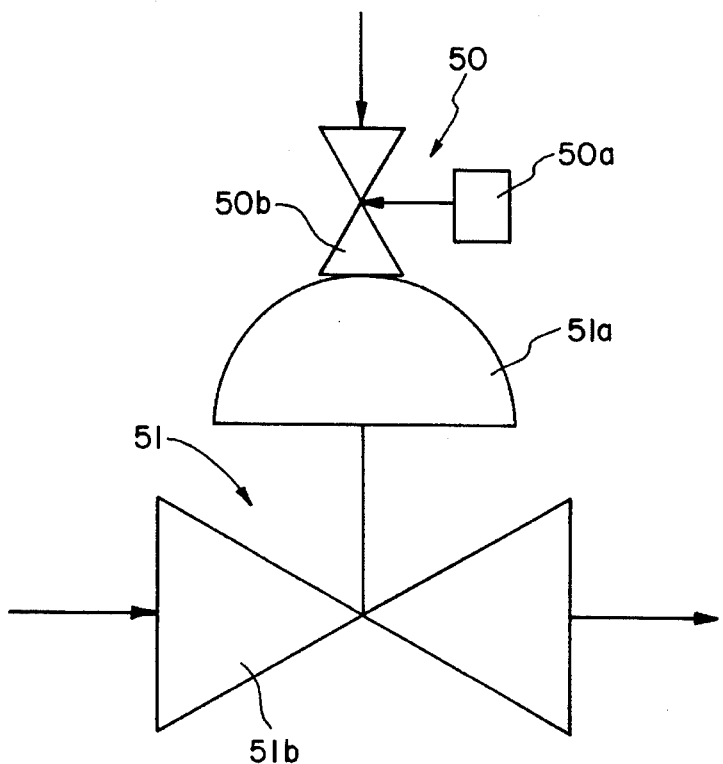
FIG. 10 is a schematic structural diagram showing the structure in the case in which an electromagnetic valve and an air-operated valve are directly connected.
Figure 11:
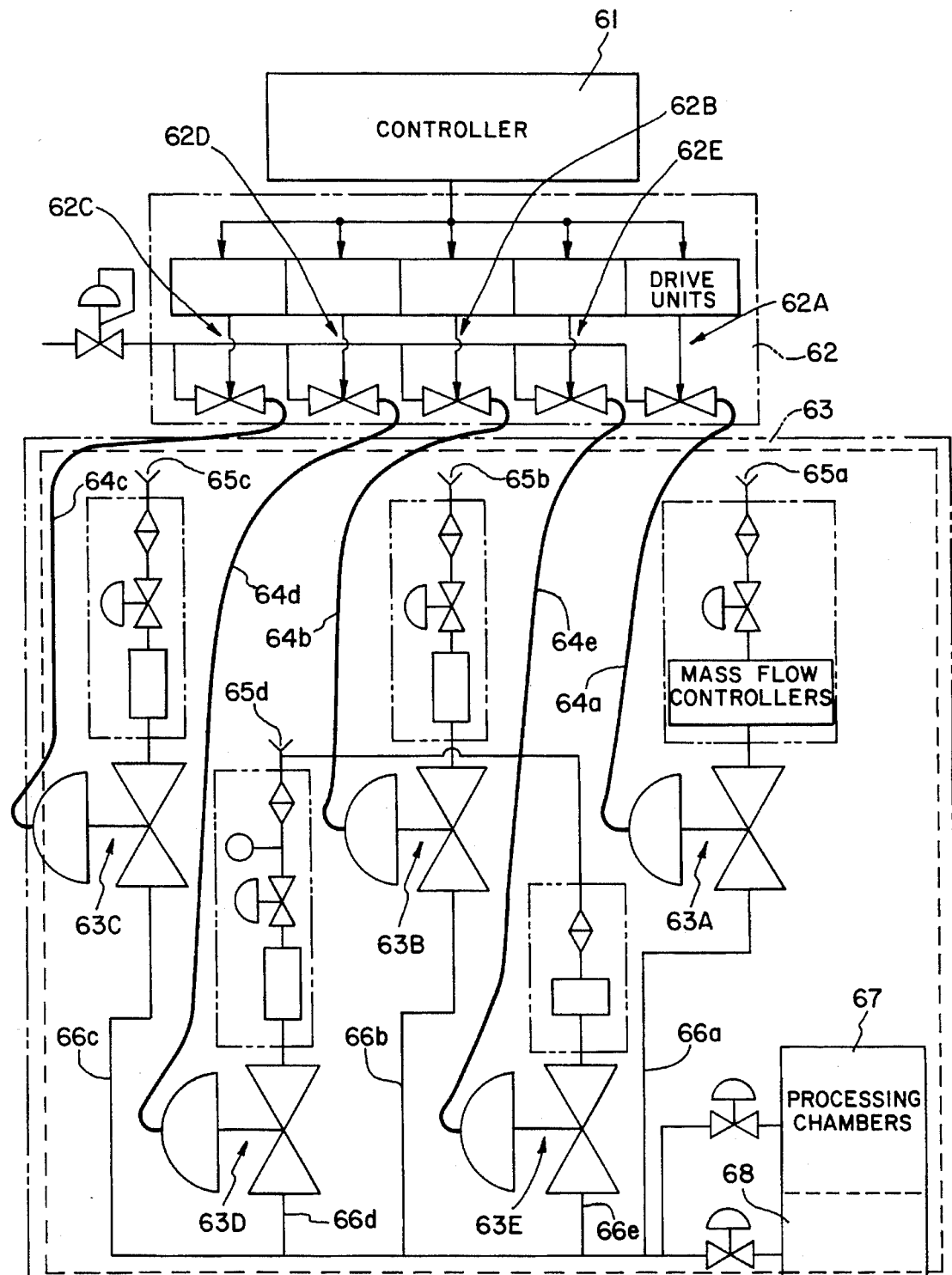
FIG. 11 is a block diagram showing the structure of a conventional supply control apparatus for special gasses.

FIG. 10 shows an example of the structure which is applied to the case in which it is necessary to eliminate the effect on the operating time of the air-operated valve resulting from the content volume of the air tube. That is to say, in this structure, the secondary pressure side of the valve unit 50b of the electromagnetic valve 50 is directly connected to the drive unit 51a of the air-operated valve 51. Reference 50a indicates the drive unit of the electromagnetic valve 50, and reference 51b indicates the main valve unit of the air-operated valve 51.

As described above, the invention in accordance with claim 1 is characterized in that, in a supply control apparatus for special gasses which is provided with: a plurality of electromagnetic valves, which are placed in open or closed states in accordance with predetermined control signals; a plurality of gas pressure operated valves which operate in accordance with the open or closed state of the plurality of electromagnetic valves, via an operating gas, and are provided with drive units, and are placed in open or closed states in accordance with the drive units; a plurality of gas tubes for conveying operating gas to the drive units of the gas pressure operated valves corresponding thereto; and a unit to be processed for supplying special gas flowing in accordance with the opened or closed state of the plurality of gas pressure operated valves, via connecting pipes; the plurality of gas tubes have content volumes which are set in accordance with the time from the input of a control signal to the supply of special gas to the unit to be processed, so that during the switching of the supply state of the special gasses to the unit to be processed, by means Of focusing on the adjustment of the content volume of the gas tube, it is possible to freely control the operating time of the air-operated valves after the operation of the electromagnetic valves, so that it is possible to set this so as to be identical to the gas supply operating time, for example, and during the switching from the supply state of one special gas to the supply state of another special gas, it is thus possible to avoid a mixed supply state of both special gasses, and it is possible to accurately conduct the timing of the switching of the supply state of the special gasses to the unit to be processed. Here, what is meant by it being possible to control the operating time is, from the opposite point of view, that it is possible to freely control the supply rate of the special gas, and, for example, as an application example of the present invention, an apparatus can be considered which reduces the purge rate of the gas supply system by means of a purge gas comprising a special gas, or which slows the supply of a process gas comprising a special gas to the unit to be processed.

In accordance with the inventions as stated in claims 2 through 4, the gas tubes are formed from easily Workable material, so that by means of adjusting the length or the inner diameter thereof, it is easily possible to conduct the adjustment of the content volume.

In accordance with the invention as stated in claim 5, by means of setting the content volume of the gas tubes to a value of 0, in other words, by means of directly connecting the electromagnetic valves and the air-operated valves, it is possible to completely eliminate the effects of the supply of the special gasses by means of the gas tubes on the supply time of the special gasses.

In accordance with the inventions as stated in claims 6 and 7, it is possible to obtain low costs by means of using air as the operating gas, and there are advantages in that problems of chemical reactivity are avoided by employing inert gas, and the like.

In accordance with the inventions as stated in claim 8, the invention possesses usefulness as a typical applied example.

I claim:

1. A supply control system for special gasses, comprising:
   a plurality of electromagnetic valves which may be placed in one of an open state and a closed state by means of control signals whereby said valves selectively enable an operating gas to flow;
   a plurality of drive units, said drive units operatively associated with an operating gas, and responsive to one of an open state and a closed state of said electromagnetic valves, said drive units respectively associated with said plurality of gas pressure operated valves;
   a plurality of gas pressure operated valves which are placed in one of an open state and a closed state by said drive units to thereby selectively enable a special gas to flow;
   a plurality of gas tubes interconnecting respective said electromagnetic valves with respective said drive units, said gas tubes conveying operating gas to said drive units;
   a process unit, said process unit connected to a plurality of connecting pipes, said plurality of connecting pipes respectively connected to said plurality of gas pressure operated valves;
   said plurality of gas tubes having respective volumes which are determined as a function of the length of time which elapses between the application of a control signal to said electromagnetic valve and the time when said special gas is supplied to said process unit.

2. A supply control apparatus for special gasses in accordance with claim 1, characterized in that said gas tubes comprise easily workable material.

3. A supply control apparatus for special gasses in accordance with claim 2, characterized in that the inner diameter of said gas tubes is constant and said valves are arranged so that the time from the input of said control signal to the supply of the special gas to said process unit is proportional to the length of said aas tubes.

4. A supply control apparatus for special gasses in accordance with claim 2, characterized in that the length of said gas tubes is constant and said valves are arranged so that the time from the input of said control signal to the supply of the special gas to said process unit is proportional to the inner diameter of said gas tubes.

5. A supply control apparatus for special gasses in accordance with claim 2, characterized in that said operating gas comprises air.

6. A supply control apparatus for special gasses in accordance with claim 2, characterized in that said operating gas comprises an inert gas.

7. A supply control apparatus for special gasses in accordance with claims 2, characterized in that said operating gas comprises an inert gas comprises a special material gas for semiconductor device manufacturing processes.

8. A supply control apparatus for special gasses in accordance with claim 1, characterized in that the inner diameter of said gas tubes is constant and said valves are arranged so that the time from the input of said control signal to the supply of the special gas to said process unit is proportional to the length of said gas tubes.

9. A supply control apparatus for special gasses in accordance with claim 8, characterized in that said operating gas comprises air.

10. A supply control apparatus for special gasses in accordance with claim 8, characterized in that said operating gas comprises an inert gas.

11. A supply control apparatus for special gasses in accordance with claim 1, characterized in that the length of said gas tubes is constant and said valves are arranged so that the time from the input of said control signal to the supply of the special gas to said process unit is proportional to the inner diameter of said gas tubes.

12. A supply control apparatus for special gasses in accordance with claim 11, characterized in that said operating gas comprises air.

13. A supply control apparatus for special gasses in accordance with claim 11, characterized in that said operating gas comprises an inert gas.

14. A supply control apparatus for special gasses in accordance with claim 1, characterized in that said content volume includes a value of zero.

15. A supply control apparatus for special gasses in accordance with claim 14, characterized in that said operating gas comprises an inert gas.

16. A supply control apparatus for special gasses in accordance with claims 14, characterized in that said operating gas comprises an inert gas.

17. A supply control apparatus for special gasses in accordance with claim 1, characterized in that said operating gas comprises air.

18. A supply control apparatus for special gasses in accordance with claim 17, characterized in that said operating gas comprises an inert gas.

19. A supply control apparatus for special gasses in accordance with claim 1, characterized in that said operating gas comprises an inert gas.

20. A supply control apparatus for special gasses in accordance with claim 1, characterized in that said special gas comprises a special material gas for semiconductor device manufacturing processes.

* * * * *